(12) United States Patent
Zhao et al.

(10) Patent No.: US 11,825,620 B2
(45) Date of Patent: Nov. 21, 2023

(54) HINGE STRUCTURE AND FOLDING ELECTRONIC DEVICE

(71) Applicant: BEIJING XIAOMI MOBILE SOFTWARE CO., LTD., Beijing (CN)

(72) Inventors: Lianjia Zhao, Beijing (CN); Yuwen Wang, Beijing (CN); Yuantao Pei, Beijing (CN); Xuehu Zhang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 515 days.

(21) Appl. No.: 16/897,767

(22) Filed: Jun. 10, 2020

(65) Prior Publication Data

US 2021/0195775 A1    Jun. 24, 2021

(30) Foreign Application Priority Data

Dec. 23, 2019    (CN) .......................... 201911342459.9

(51) Int. Cl.
*H05K 5/00*    (2006.01)
*H05K 5/02*    (2006.01)
(Continued)

(52) U.S. Cl.
CPC ........... *H05K 5/0226* (2013.01); *E05D 3/122* (2013.01); *E05D 11/0054* (2013.01);
(Continued)

(58) Field of Classification Search
None
See application file for complete search history.

(56) References Cited

U.S. PATENT DOCUMENTS 10,545,541 B1 *   1/2020  Dighde ................. F16M 11/38
2007/0213000 A1 * 9/2007  Day ................... H05K 7/20754
                                                          361/695

(Continued)

FOREIGN PATENT DOCUMENTS

CN    108076171 A    5/2018
KR    102036913 B1   10/2019

OTHER PUBLICATIONS

Extended European Search Report in Application No. 20186836.1, dated Feb. 12, 2021.
(Continued)

*Primary Examiner* — Anthony Q Edwards
*Assistant Examiner* — Rashen E Morrison
(74) *Attorney, Agent, or Firm* — SYNCODA LLC; Feng Ma

(57) ABSTRACT

A hinge structure includes housing and at least one first hinge, the first hinge includes trajectory limiting mechanism including first hinge bracket connected to the housing, first slider including first hollow chute, and second slider including second hollow chute; and synchronization mechanism including cylindrical gear set, first guide gear, and second guide gear, first guide gear and second guide gear including gear end and guide end respectively, the gear end of first guide gear engaging with end gear of the cylindrical gear set, the gear end of second guide gear engaging with another end gear of the cylindrical gear set, the guide end of first guide gear being in sliding fit with first hollow chute, and the guide end of the second guide gear being in sliding fit with second hollow chute, to drive the first and second sliders respectively to rotate with respect to first hinge bracket.

20 Claims, 9 Drawing Sheets

(51) Int. Cl.
*E05D 3/12* (2006.01)
*E05D 11/00* (2006.01)
*G06F 1/16* (2006.01)
*H04M 1/02* (2006.01)

(52) U.S. Cl.
CPC .......... *G06F 1/1616* (2013.01); *G06F 1/1652* (2013.01); *G06F 1/1681* (2013.01); *E05Y 2201/11* (2013.01); *E05Y 2900/606* (2013.01); *H04M 1/0268* (2013.01)

(56) References Cited

U.S. PATENT DOCUMENTS

| | | | | |
|---|---|---|---|---|
| 2011/0307102 | A1* | 12/2011 | Czamara | H05K 7/20836 700/282 |
| 2011/0316337 | A1* | 12/2011 | Pelio | H05K 7/1492 307/24 |
| 2012/0092811 | A1* | 4/2012 | Chapel | H02B 1/04 361/622 |
| 2016/0021793 | A1* | 1/2016 | Chen | H05K 7/202 361/679.02 |
| 2017/0013745 | A1* | 1/2017 | Wilcox | H05K 7/20745 |
| 2017/0359917 | A1* | 12/2017 | Bailey | H05K 7/1485 |
| 2018/0335679 | A1 | 11/2018 | Hashimoto et al. | |
| 2018/0356858 | A1 | 12/2018 | Siddiqui et al. | |
| 2019/0171799 | A1* | 6/2019 | Crawford | H05K 7/2079 |
| 2020/0146186 | A1* | 5/2020 | Fotouh | E04B 2/7401 |
| 2020/0265175 | A1* | 8/2020 | Martin | G06F 3/04815 |
| 2021/0219460 | A1* | 7/2021 | Bailey | H05K 7/20754 |
| 2021/0337687 | A1* | 10/2021 | Chen | H05K 5/0226 |

OTHER PUBLICATIONS

China first office action in Application No. 201911342459.9, dated Mar. 29, 2022.

\* cited by examiner

HINGE STRUCTURE AND FOLDING ELECTRONIC DEVICE

CROSS-REFERENCE TO RELATED APPLICATION

This application claims priority to Chinese Patent Application No. 201911342459.9 filed on Dec. 23, 2019, the disclosure of which is hereby incorporated by reference in its entirety.

BACKGROUND

With the development of flexible OLED display technologies and folding electronic devices, combined with portability of many electronic devices and the ultimate experience of large-screen display, folding electronic devices have become trendy in the development of mobile terminals, and have become an important area of competition among major terminal manufacturers.

SUMMARY

The present disclosure generally relates to the technical field of terminals, and more specifically, to a hinge structure and a folding electronic device.

According to a first aspect of embodiments of the present disclosure, there is provided a hinge structure applied to a folding electronic device, the hinge structure includes a housing and at least one first hinge, and the first hinge includes:

a trajectory limiting mechanism including a first hinge bracket fixedly connected to the housing, a first slider which includes a first hollow chute, and a second slider which includes a second hollow chute; and a synchronization mechanism including a cylindrical gear set, a first guide gear, and a second guide gear, the first guide gear and the second guide gear including a gear end and a guide end respectively, the gear end of the first guide gear engaging with an end gear of the cylindrical gear set, the gear end of the second guide gear engaging with another end gear of the cylindrical gear set, the guide end of the first guide gear being in sliding fit with the first hollow chute, and the guide end of the second guide gear being in sliding fit with the second hollow chute, so as to drive the first slider and the second slider to rotate with respect to the first hinge bracket, respectively.

In some embodiments, the first hinge bracket includes a first arc guide portion, the first slider includes a first arc portion, the second slider includes a second arc portion, and the first arc portion and the second arc portion fit with the first arc guide portion, respectively.

In some embodiments, the first hinge bracket further includes two standing blocks extending upward from a bottom surface of the first arc guide portion; and the gear end of the first guide gear, the gear end of the second guide gear, and the cylindrical gear set are located between the two standing blocks.

In some embodiments, the first slider includes a first recessed portion formed by being recessed along a length direction of the first hollow chute, the second slider includes a second recessed portion formed by being recessed along a length direction of the second hollow chute, and the first recessed portion and the second recessed portion are both used to avoid the two standing blocks.

In some embodiments, at least a part of the second arc portion is located in the first recessed portion; alternatively, at least a part of the first arc portion is located in the second recessed portion.

In some embodiments, the first slider further includes a first conducting portion, and the first hollow chute penetrates to the outside of the first slider through the first conducting portion;

the second slider further includes a second conducting portion, and the second hollow chute penetrates to the outside of the second slider through the second conducting portion; and the first guide gear includes a first raised portion, the second guide gear includes a second raised portion, and a part of the first raised portion projects into the first conducting portion, and a part of the second raised portion projects into the second conducting portion.

In some embodiments, there is included a second hinge including a second hinge bracket, a third slider and a fourth slider, the second hinge bracket is fixedly connected to the housing, and the second hinge bracket includes a second arc guide portion; and the third slider includes a third arc portion, the fourth slider includes a fourth arc portion, and the third arc portion and the fourth arc portion fit with the second arc guide portion, respectively.

In some embodiments, the hinge structure includes two of the first hinges and one of the second hinges, and the second hinge is located between the two first hinges.

In some embodiments, there is further included a supporting steel sheet, fixedly connected to a middle frame of the folding electronic device, and the first slider and the second slider are both fixedly connected to the supporting steel sheet.

In some embodiments, the cylindrical gear set includes a first gear and a second gear which engage with each other, the first gear engages with the gear end of the first guide gear, and the second gear engages with the gear end of the second guide gear.

In some embodiments, ends of the guide ends of the first guide gear and the second guide gear are provided in a cylindrical shape.

According to a second aspect of embodiments of the present disclosure, there is provided a folding electronic device, comprising:

a middle frame;

a hinge structure, connected to the middle frame, according to any one of the above embodiments.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this description, illustrate embodiments consistent with the disclosure and, together with the description, serve to explain the principles of the disclosure.

DETAILED DESCRIPTION

Description will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

The terminology used in the present disclosure is for the purpose of describing particular example embodiments only and is not intended to be limiting of the present inventive concept. As used the present disclosure and the appended claims, the singular forms "a," "said" and "the" are intended to include the plural forms as well, unless the context clearly indicates otherwise. It will be further understood that the terms "and/or" used herein refers to that also include any or all possible combinations of one or more of the associated listed items It is to be understood that, although the terms such as first, second and third can be used in the present disclosure to describe various information, the information should not be limited to these terms. These terms are for the purpose of distinguishing the same type of information from each other only. For instance, without departing from the scope of the present disclosure, the first information can also be referred to as the second information, and similarly, the second information can also be referred to as the first information. Depending on the context, the word "if" used herein can be interpreted as "at" or "when" or "in response to determination".

Figure 1:
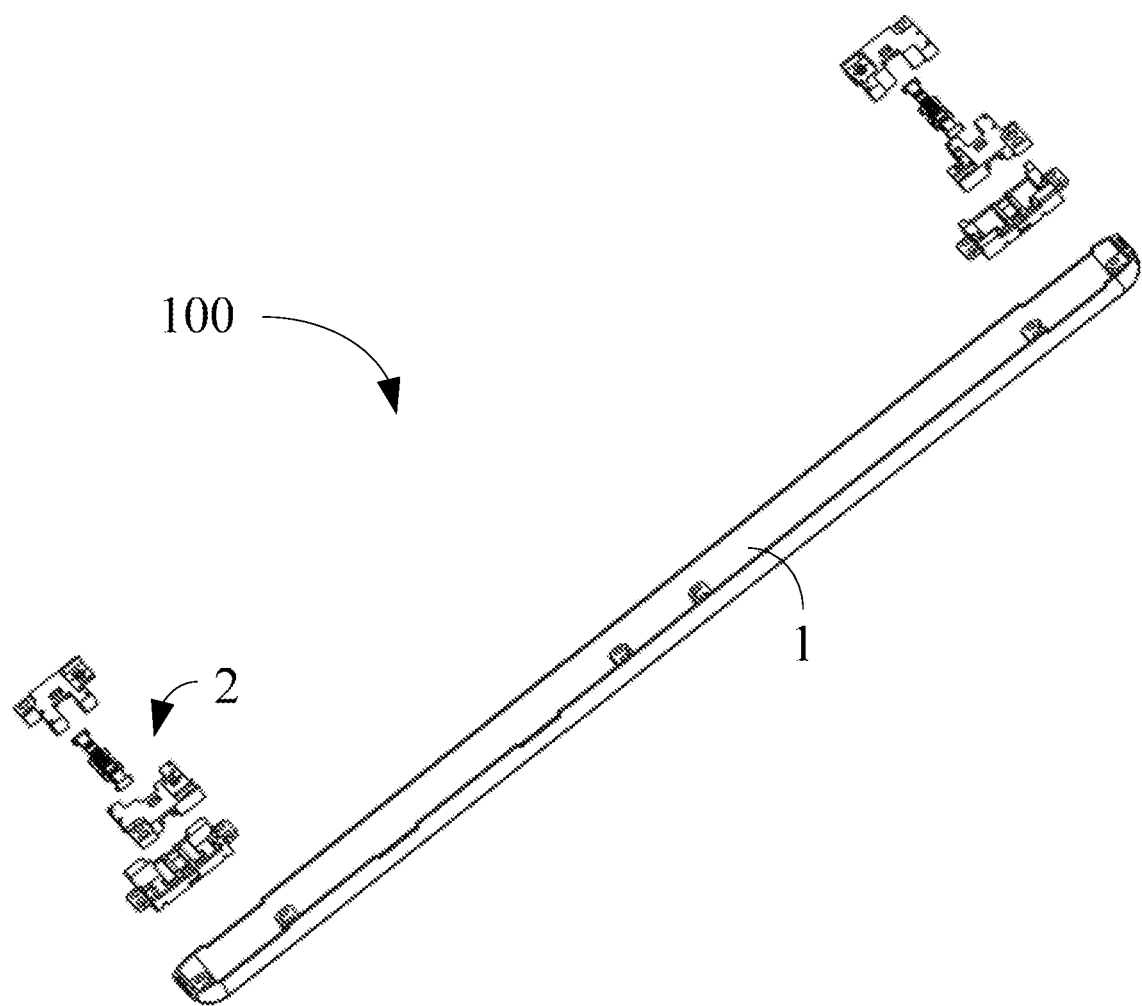
FIG. 1 is a decomposed schematic diagram illustrating a hinge structure according to some embodiments.
Figure 2:
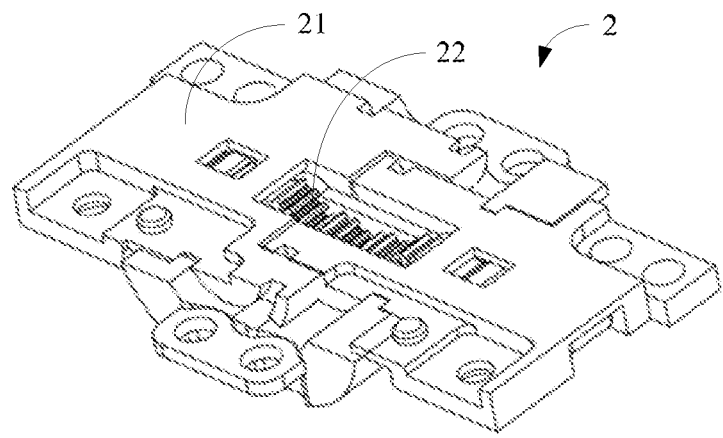
FIG. 2 is an expanding schematic diagram illustrating the first hinge according to some embodiments.
Figure 3:
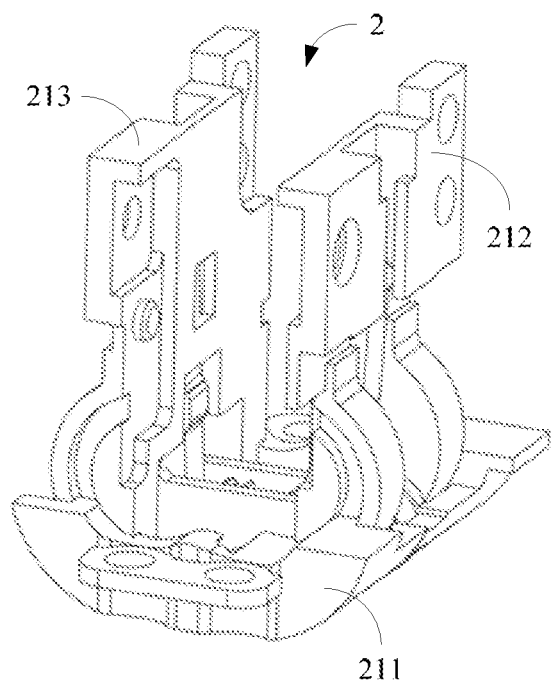
FIG. 3 is a folding schematic diagram illustrating the first hinge according to some embodiments.
Figure 4:
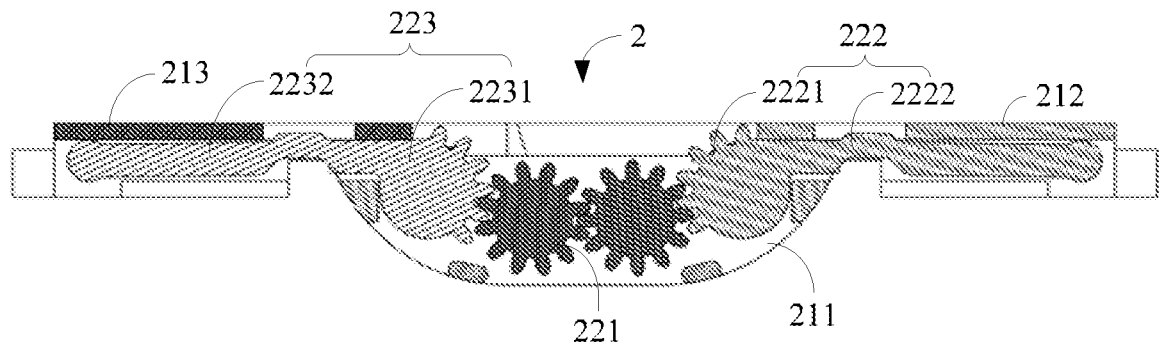
FIG. 4 is an expanding simplified diagram illustrating the first hinge according to some embodiments.
Figure 5:
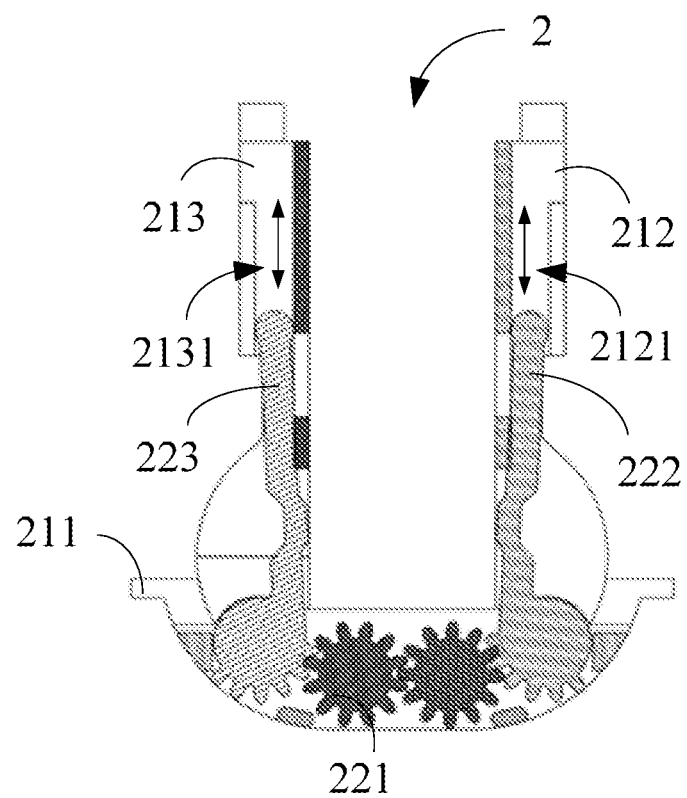
FIG. 5 is a folding simplified diagram illustrating the first hinge according to some embodiments.

FIG. 1 is the decomposed schematic diagram illustrating a hinge structure 100 according to some embodiments. FIG. 2 is the expanding schematic diagram illustrating a first hinge according to some embodiments. FIG. 3 is the folding schematic diagram illustrating the first hinge according to some embodiments. FIG. 4 is the expanding simplified diagram illustrating the first hinge according to some embodiments. FIG. 5 is the folding simplified diagram illustrating the first hinge according to some embodiments. As shown in FIG. 1 to FIG. 5, the hinge structure 100 can be used for a folding electronic device, so that the folding electronic device can be driven to be bent by the hinge structure 100. For instance, the folding electronic device can be driven to fold in both of the left and right directions, or the folding electronic device can be driven to be folded in both of the upper and lower directions. The hinge structure 100 can include a housing 1 and at least one first hinge 2, as shown in FIG. 1, the hinge structure 100 can include two first hinges, or in other embodiments, the hinge structure 100 can also include one or three or more first hinges, which is not limited in this disclosure.

As shown in FIG. 2 to FIG. 4, the first hinge 2 can include a trajectory limiting mechanism 21 and a synchronization mechanism 22. The trajectory limiting mechanism 21 can be used to limit a rotation direction of the first hinge 2, and the synchronization mechanism 22 can be used to realize the rotation of the first hinge 2. Specifically, the trajectory limiting mechanism 21 can include a first hinge bracket 211, a first slider 212, and a second slider 213, the first hinge bracket 211 can be connected to the housing 1, for instance, the first hinge bracket 211 can be fixedly connected to the housing 1 by screws or bolts, or can be fixed to the housing 1 by welding, which is not limited in the present disclosure. The first slider 212 can include a first hollow chute 2121, and the second slider 213 can include a second hollow chute 2131, that is, the first slider 212 and the second slider 213 can be partially shorted to obtain a corresponding hollow chute. The synchronization mechanism 22 can include a cylindrical gear set 221, a first guide gear 222, and a second guide gear 223, and the first guide gear 222 can include a gear end 2221 and a guide end 2222, and similarly, the second guide gear 223 can also include a corresponding gear end 2231 and a guide end 2232. The gear end 2221 of the first guide gear 222 engages with an end gear of the cylindrical gear set 221, and the gear end 2231 of the second guide gear 223 engages with another end gear of the cylindrical gear set 221; the guide end 2222 of the first guide gear 222 fits with the first hollow chute 2121, and the guide end 2232 of the second guide gear 223 fits with the second hollow chute 2131.

In view of this, when an external force is applied to the electronic device provided with the hinge structure 100 and the force is further transmitted to the first slider 212, the gear end 2221 can transmit power to the cylindrical gear set 221 by the slide of the guide end 2222 of the first guide gear 222 in the first hollow chute 2121, and the power is further transmitted to the gear end 2231 of the second guide gear 223, so as to drive the guide end 2232 of the second guide gear 223 to slide in the second hollow chute 2131. Due to the limitation of the first hollow chute 2121 and the second hollow chute 2131, the first hinge 2 can be switched between the state shown in FIG. 2 and the state shown in FIG. 3, or between the state shown in FIG. 4 and the state shown in FIG. 5, that is, the angle of the first slider 212 relative to the first hinge bracket 211 and the angle of the second slider 213 relative to the first hinge bracket 211 at the same time can be substantially the same (that is, the difference between the angle between the first slider 212 and the first hinge bracket 211 and the angle between the second slider 213 and the first hinge bracket 211 is relatively small, and is within a permissible range), a synchronous movement between the first slider 212 and the second slider 213 is basically achieved. Of course, only the force applying to the first slider 212 is described here as an example, the case in which the force is transmitted to the second slider 213 or the case in which the force is transmitted to the first slider 212 and the second slider 213 can refer to the embodiment described above, and details are not described herein again.

It can be known from the above embodiments that the cylindrical gear set 221 in the present disclosure can enable the power to be substantially linear when the power is transmitted from the first slider 212 to the second slider 213 side, or from the second slider 213 to the first slider 212 side, and thus when the first slider 212 and the second slider 213 are opposite to each other, the first slider 212 and the second slider 213 can be driven to rotate with respect to the first hinge bracket 211 through the cooperation of the cylindrical gear set 221, the first guide gear 222 and the second guide gear 223, which can avoid a torque generated in the synchronization mechanism 22 and the trajectory limiting mechanism 21 due to the misalignment of the first slider 212 and the second slider 213, and is beneficial to extending the life of the hinge structure 100.

Figure 6:
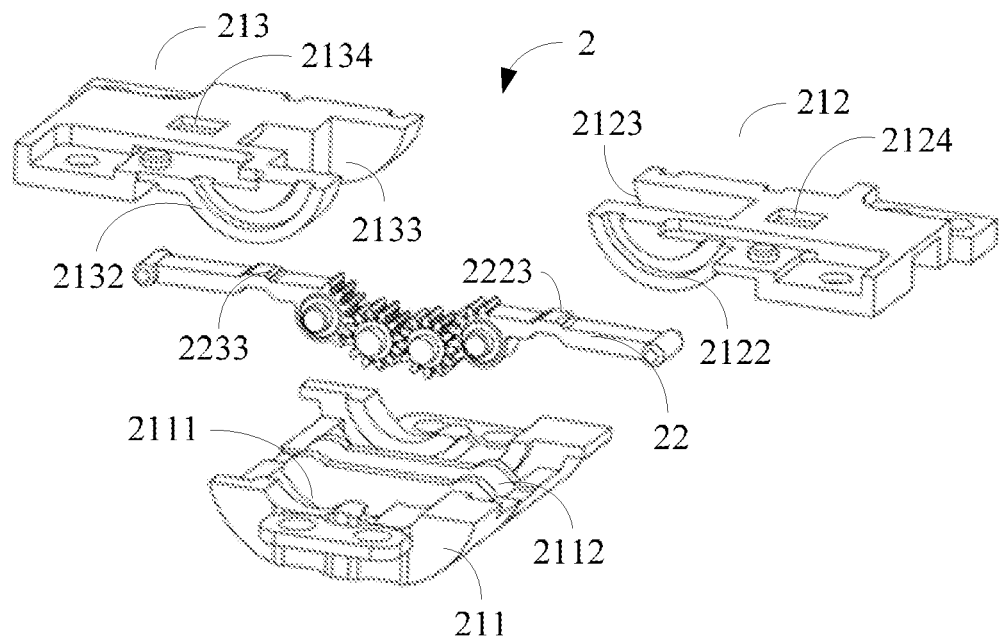
FIG. 6 is a decomposed schematic diagram illustrating the first hinge according to some embodiments.

In the embodiment, in order to realize the rotation of the first slider 212 and the second slider 213 relative to the first hinge bracket 211, as shown in FIG. 6, the first hinge bracket 211 can include a first arc guide portion 2111, the first slider 212 can include a first arc portion 2122, and the second slider 213 can include a second arc portion 2132, the first arc portion 2122 and the second arc portion 2132 cooperate with the first arc guide portion 2111, respectively. For instance, the outer arc surfaces of the first arc portion 2122 and the second arc portion 2132 are in contact with the arc surfaces of the first arc guide portion 2111 facing the first slider 212 and the second slider 213, in this way, when the synchronization mechanism 22 rotates, the first arc portion 2122 and the second arc portion 2132 rotate under the limitation of the first arc guide portion 2111, so that the movement trajectories of the first slider 212 and the second slider 213 are constant, and a side round angle of the hinge structure 100 after being folded is determined by the first round guide 2111, and the round corner of the first arc guide portion 2111 is a fixed value, so as to ensure that the side round angle of the hinge structure 100 after being folded is constant, which is beneficial to reduce the screen damage for the folding electronic device.

In the embodiment, in order to reduce the thickness of the first hinge 2, as still shown in FIG. 6, the first hinge bracket 211 can further include two standing blocks 2112 extending upward from the bottom surface of the first arc guide portion 2111 respectively, and there can be a certain interval distance between the two standing blocks 2112, so that the gear end 2221 of the first guide gear 222, the gear end 2231 of the second guide gear 223, and the cylindrical gear set 221 are disposed between the two standing blocks 2112. The area on the bottom surface of the first arc guide portion 2111 between the two standing blocks 2112 can be designed adaptively with regard to the gear end 2221 of the first guide gear 222, the gear end 2231 of the second guide gear 223, and the cylindrical gear set 221, which is not limited in the present disclosure.

In the embodiment, since an avoiding portion formed by the limitation of the standing blocks exists in the first arc guide portion 2111, in order to avoid the avoiding portion, the first slider 212 can include a first recessed portion 2123 recessed along a length direction of the first hollow chute 2121, the second slider 213 can include a second recessed portion 2133 recessed along a length direction of the second hollow chute 2131, and both the first recessed portion 2123 and the second recessed portion 2133 can give way to the avoiding portion. Moreover, as shown in FIG. 6, in order to shorten the length of the first hinge 2 in the length direction of the first hollow chute 2121 and the second hollow chute 2131, a part of the first arc portion 2122 included in the first slider 212 can be located in the second recessed portion 2133, alternatively, a part of the second arc portion 2132 included in the second slider 213 can be located in the first recessed portion 2123 in other embodiments, which is not limited in the present disclosure.

In each of the above embodiments, still taking FIG. 6 as an example, the first slider 212 can further include a first conducting portion 2124, and the first hollow chute 2121 can penetrate to the outside through the first conducting portion 2124; and similarly, the second slider 213 can further include a second conducting portion 2134, and the second hollow chute 2131 can penetrate to the outside through the second conducting portion 2134. The first guide gear 222 can further include a first raised portion 2223, the second guide gear 223 can further include a second raised portion 2233, and a part of the first raised portion 2223 projects into the first conducting portion 2124, and a part of the second raised portion 2233 projects into the second conducting portion 2134. In this way, when the hinge structure 100 is completely deployed, the first raised portion 2223 can be limited through the side of the first conducting portion 2124 close to the first recessed portion 2123, and the second raised portion 2233 can be limited through the side of the second conducting portion 2134 close to the second recessed portion 2133; and when the hinge structure 100 is completely folded, the first raised portion 2223 can be limited through the side of the first conducting portion 2124 away from the first recessed portion 2123, and the second raised portion 2233 can be limited through the side of the second conducting portion 2134 away from the second recessed portion 2133, thereby the hinge structure 100 is prevented from being deployed or folded excessively.

Figure 7:
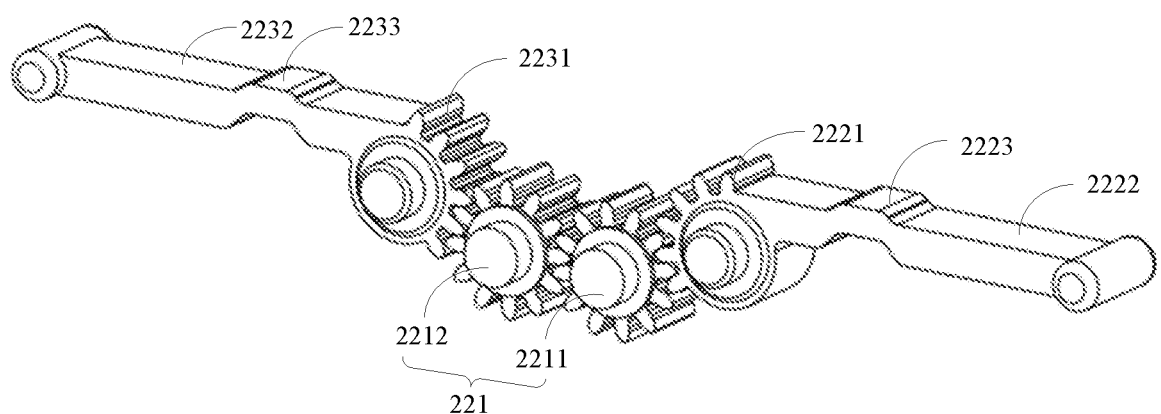
FIG. 7 is a structural schematic diagram illustrating a synchronization mechanism according to some embodiments.

Based on the above respective embodiments, as shown in FIG. 7, the ends of the guide end 2222 of the first guide gear 222 and the guide end 2232 of the second guide gear 223 can be provided in a cylindrical shape to reduce the frictional force when the guide end 2222 of the guide gear 222 slides in the first hollow chute 2121 and the guide end 2232 of the second guide gear 223 slides in the second hollow chute 2131, such that the user experience can be improved.

Referring to FIG. 7, in some embodiments, the cylindrical gear set 221 in the above embodiments is described. As shown in FIG. 7, the cylindrical gear set 221 can include a first gear 2211 and a second gear 2212 that engage with each other, the first gear 2211 engages with the gear end 2221 of the first guide gear 222, and the second gear 2212 engages with the gear end 2231 of the second guide gear 223, in this way, the number of gear engaging points can be reduced as much as possible, which is beneficial to reduce the cumulative tolerance, thereby the delay between the rotation of the first slider 212 and the rotation of the second slider 213 is reduced, and synchronization effect and folding effect when the hinge structure 100 is folded are improved.

Figure 8:
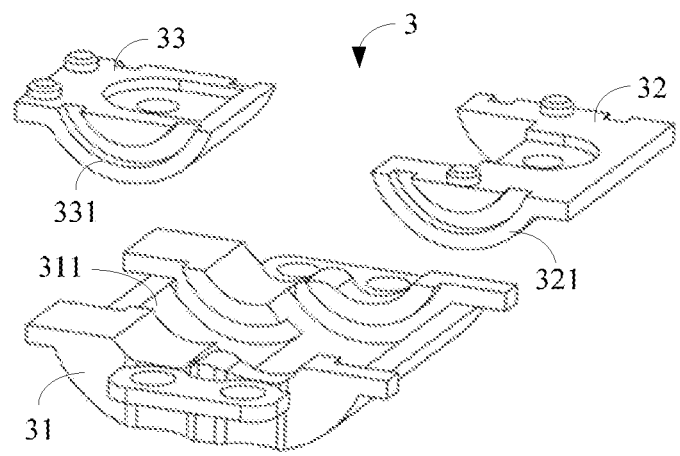
FIG. 8 is a decomposed schematic diagram illustrating a second hinge according to some embodiments.
Figure 9:
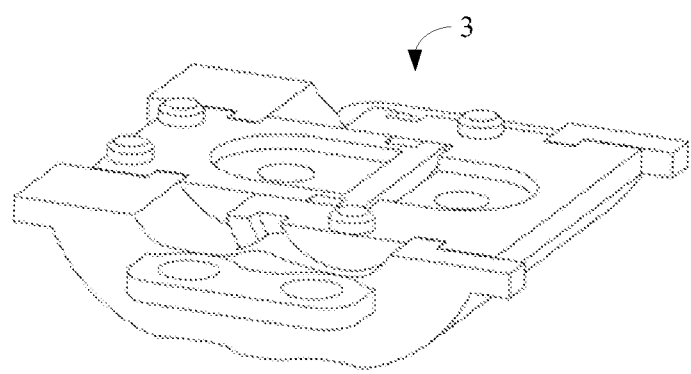
FIG. 9 is an expanding schematic diagram illustrating the second hinge according to some embodiments.
Figure 10:
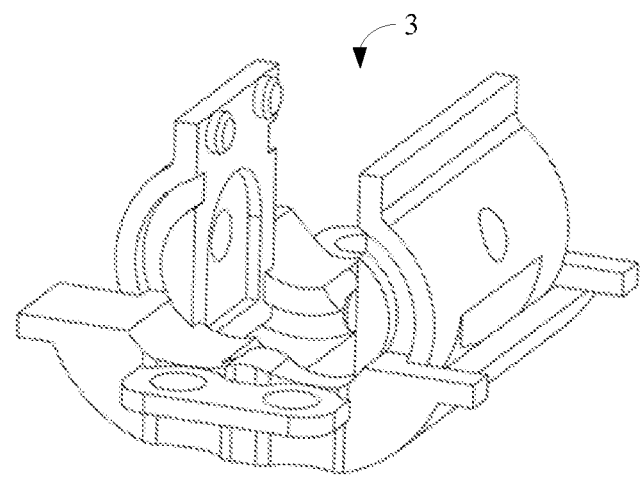
FIG. 10 is a folding schematic diagram illustrating the second hinge according to some embodiments.

According to some embodiments of the present disclosure, as shown in FIGS. 8-10, the hinge structure 100 can further include a second hinge 3, and the second hinge 3 can include a second hinge bracket 31, a third slider 32, and a fourth slider 33, the second hinge bracket 31 can be fixedly connected to the housing 1. Herein, the second hinge bracket 31 can further include a second arc guide portion 311, the third slider 32 can include a third arc portion 321, the fourth slider 33 can include a fourth arc portion 331, and both the third arc portion 321 and the fourth arc portion 331 cooperate with the second arc guide portion 311, so that the third arc portion 321 and the fourth arc portion 331 can be driven to rotate with respect to the second arc guide portion 311 when the motion on the first hinge 2 is transmitted to the second hinge 3, and the second hinge 3 is switched between the state shown in FIG. 9 and the state shown in FIG. 10. The outer round corners of the second arc guide portion 311 can be equal to the outer round corners of the first arc guide portion 2111 to improve the aesthetics of the hinge structure 100. Herein, the other structures of the second hinge 3 can refer to the trajectory limiting mechanism 21 of the first hinge 2, and the description is not repeated herein.

Figure 11:
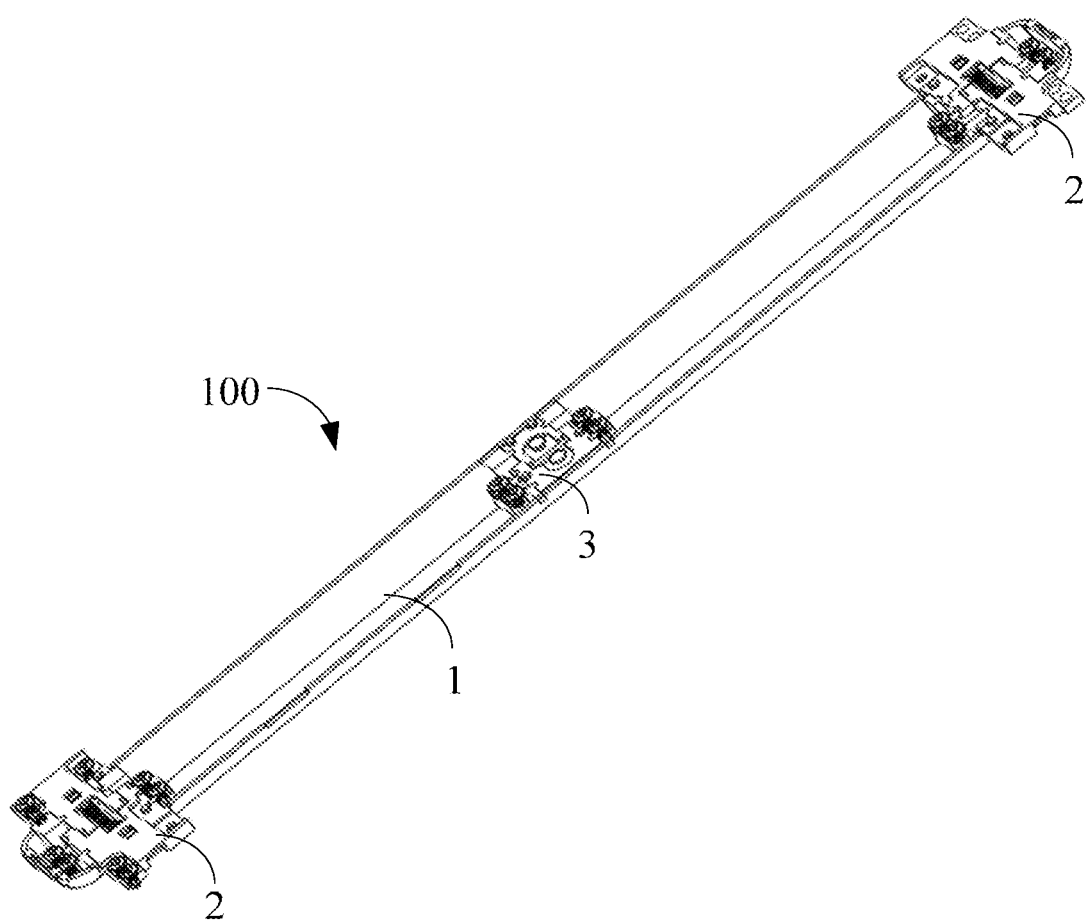
FIG. 11 is a structural schematic diagram illustrating another hinge structure according to some embodiments.

As shown in FIG. 11, the first hinge 2 and the second hinge 3 can be included in the same hinge structure 100. Taking FIG. 11 as an example, it can be assumed that the hinge structure 100 includes a second hinge 3 and two first hinges 2, since the first hinge 2 can limit the folding trajectory of the hinge structure 100, the two first hinges 2 can be arranged at the end of the housing 1, and the second hinge 3 can be arranged between the two first hinges 2, in this way, the structure can be reduced, and the folding requirements can be satisfied.

Figure 12:
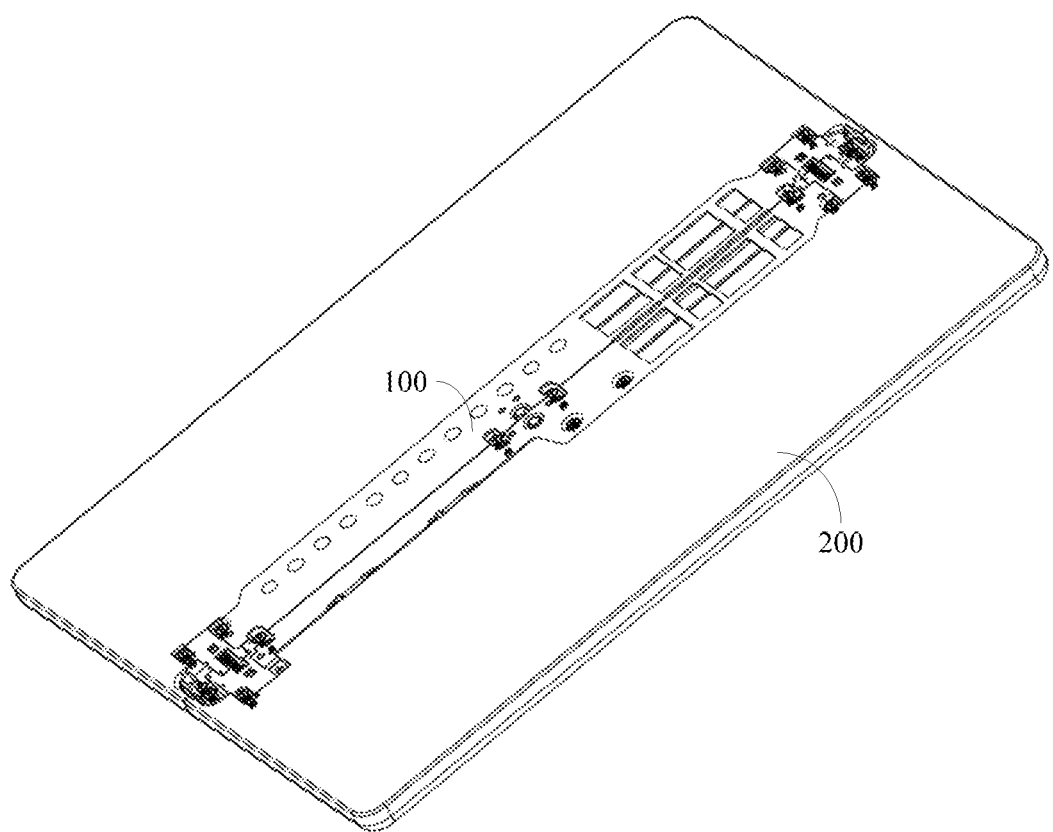
FIG. 12 is a schematic diagram illustrating the cooperation between a hinge structure and a middle frame according to some embodiments.
Figure 13:
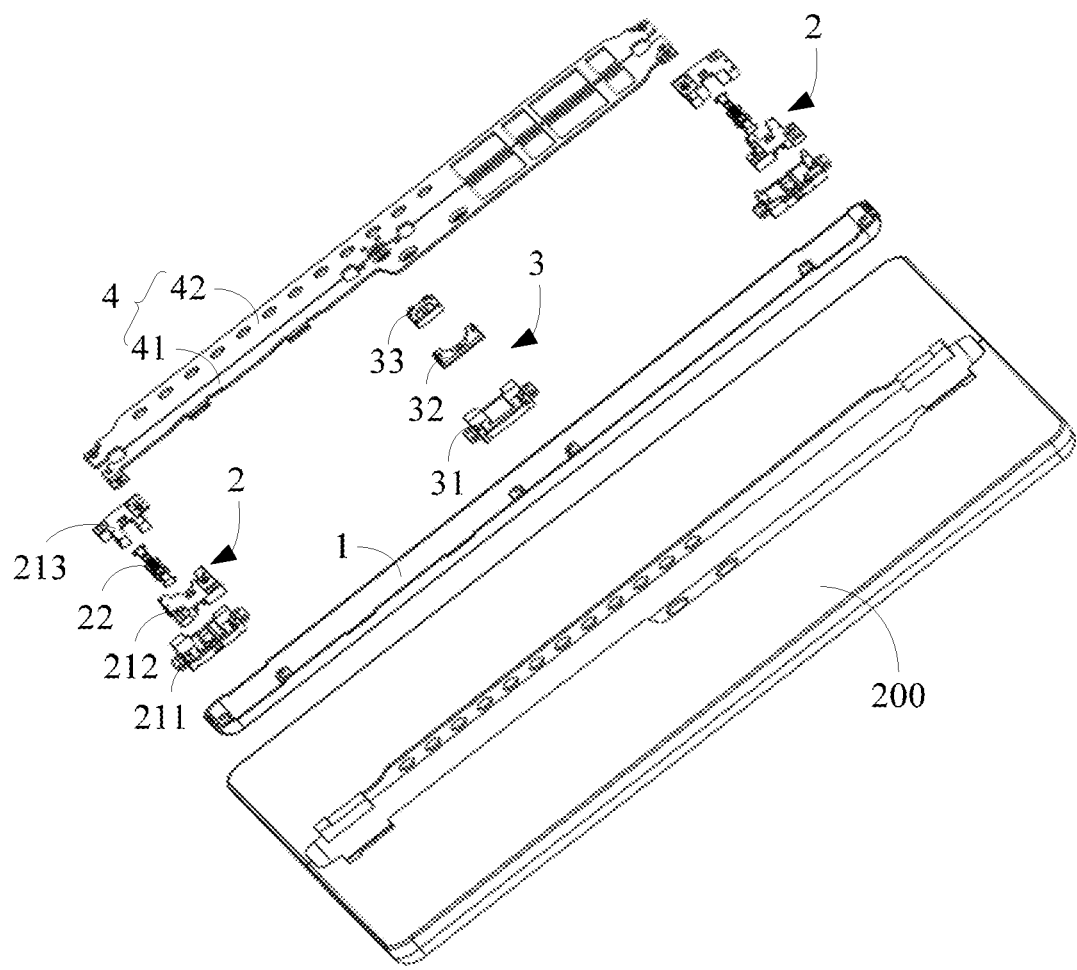
FIG. 13 is a decomposed schematic diagram illustrating a hinge structure and a middle frame according to some embodiments.

As shown in FIG. 12 and FIG. 13, the hinge structure 100 can further include a supporting steel sheet 4 that can be fixedly connected to a middle frame 200 of the folding electronic device, the first slider 212, the second slider 213, the third slider 32 and the fourth slider 33 are all fixedly connected to the supporting steel sheet 4. As shown in FIG. 13, the supporting steel sheet 4 can include a first supporting sheet 41 and a second supporting sheet 42 connected rotatably to the first supporting sheet 41, the first supporting sheet 41 is fixedly connected to the slider close to the first supporting sheet 41, and the second supporting sheet 42 is fixedly connected to the slider close to the second supporting sheet 42. As shown in FIG. 13, the first supporting sheet 41 is fixedly connected to the first slider 212 and the third slider 32, and the second supporting sheet 42 is fixedly connected to the second slider 231 and the fourth slider 33.

Based on the hinge structure 100 described in the above respective embodiments, the present disclosure further provides an electronic device, the electronic device can include the middle frame 200 and the hinge structure 100, the hinge structure 100 is connected to the middle frame 200, and specifically, the connection can be made through the first slider 212, the second slider 213, the third slider 32 and the fourth slider 33, or the supporting steel sheet 4. The electronic device can be a holding terminal or an electronic reader, which is not limited in the present disclosure.

Various embodiments of the present disclosure can have one or more of the following advantages:

The cylindrical gear set can enable power to be substantially linear when the power is transmitted from the first slider to the second slider side, or from the second slider to the first slider side such that when the first slider and the second slider are disposed opposite to each other, the first slider and the second slider can be driven to rotate with respect to the first hinge bracket through the cooperation of the cylindrical gear set, the first guide gear and the second guide gear, which can avoid a torque generated in the synchronization mechanism and the trajectory limiting mechanism due to the misalignment of the first slider and the second slider, and is beneficial to extend the life of the hinge structure.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms, and these phrases may be interchangeably used.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon is further provided. For example, the non-transitory computer-readable storage medium can be a ROM, a CD-ROM, a magnetic tape, a floppy disk, optical data storage equipment, a flash drive such as a USB drive or an SD card, and the like.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A hinge structure applied to a folding electronic device, wherein the hinge structure comprises a housing and at least one first hinge, and the first hinge comprises:
   a trajectory limiting mechanism including a first hinge bracket fixedly connected to the housing, a first slider which comprises a first hollow chute, and a second slider which comprises a second hollow chute; and
   a synchronization mechanism including a cylindrical gear set, a first guide gear being a single component and comprising a gear end and a guide end, and a second guide gear being a single component and comprising a gear end and a guide end, the gear end of the first guide gear engaging with an end gear of the cylindrical gear set, the gear end of the second guide gear engaging with another end gear of the cylindrical gear set, the guide end of the first guide gear being in sliding fit with the first hollow chute, and the guide end of the second guide gear being in sliding fit with the second hollow chute, so as to drive the first slider and the second slider respectively to rotate with respect to the first hinge bracket.

2. The hinge structure of claim 1, wherein the first hinge bracket comprises a first arc guide portion, the first slider comprises a first arc portion, the second slider comprises a second arc portion, and the first arc portion and the second arc portion fit with the first arc guide portion, respectively.

3. The hinge structure of claim 2, wherein the first hinge bracket further comprises two standing blocks extending upward from a bottom surface of the first arc guide portion; and
   the gear end of the first guide gear, the gear end of the second guide gear, and the cylindrical gear set are located between the two standing blocks.

4. The hinge structure of claim 3, wherein the first slider comprises a first recessed portion formed by being recessed along a length direction of the first hollow chute, the second slider comprises a second recessed portion formed by being recessed along a length direction of the second hollow chute, and the first recessed portion and the second recessed portion are both used to avoid the two standing blocks.

5. The hinge structure of claim 4, wherein at least a part of the second arc portion is located in the first recessed portion.

6. The hinge structure of claim 4, wherein at least a part of the first arc portion is located in the second recessed portion.

7. The hinge structure of claim 1, wherein,
   the first slider further comprises a first conducting portion, and the first hollow chute penetrates to the outside of the first slider through the first conducting portion;
   the second slider further comprises a second conducting portion, and the second hollow chute penetrates to the outside of the second slider through the second conducting portion; and
   the first guide gear comprises a first raised portion, the second guide gear comprises a second raised portion, and a part of the first raised portion projects into the first conducting portion, and a part of the second raised portion projects into the second conducting portion.

8. The hinge structure of claim 1, further comprising:
   a second hinge including a second hinge bracket, a third slider and a fourth slider, the second hinge bracket being fixedly connected to the housing, and the second hinge bracket including a second arc guide portion; and
   the third slider including a third arc portion, the fourth slider including a fourth arc portion, and the third arc portion and the fourth arc portion fitting with the second arc guide portion, respectively.

9. The hinge structure of claim 7, wherein the hinge structure comprises two of the first hinges and one of the second hinges, and the second hinge is located between the two first hinges.

10. The hinge structure of claim 1, further comprising: a supporting steel sheet fixedly connected to a middle frame of the folding electronic device, and the first slider and the second slider being both fixedly connected to the supporting steel sheet.

11. The hinge structure of claim 1, wherein the cylindrical gear set comprises a first gear and a second gear which engage with each other, the first gear engages with the gear end of the first guide gear, and the second gear engages with the gear end of the second guide gear.

12. The hinge structure of claim 1, wherein ends of the guide ends of the first guide gear and the second guide gear are provided in a cylindrical shape.

13. A folding electronic device comprising the hinge structure of claim 1, further comprising:
a middle frame; and
wherein the hinge structure is connected to the middle frame.

14. The folding electronic device of claim 13, wherein the first hinge bracket comprises a first arc guide portion, the first slider comprises a first arc portion, the second slider comprises a second arc portion, and the first arc portion and the second arc portion fit with the first arc guide portion, respectively.

15. The folding electronic device of claim 14, wherein:
the first hinge bracket further comprises two standing blocks extending upward from a bottom surface of the first arc guide portion;
the gear end of the first guide gear, the gear end of the second guide gear, and the cylindrical gear set are located between the two standing blocks;
the first slider comprises a first recessed portion formed by being recessed along a length direction of the first hollow chute;
the second slider comprises a second recessed portion formed by being recessed along a length direction of the second hollow chute; and
the first recessed portion and the second recessed portion are both used to avoid the two standing blocks.

16. The folding electronic device of claim 15, wherein at least a part of the second arc portion is located in the first recessed portion.

17. The folding electronic device of claim 15, wherein at least a part of the first arc portion is located in the second recessed portion.

18. The folding electronic device of claim 13, wherein,
the first slider further comprises a first conducting portion, and the first hollow chute penetrates to the outside of the first slider through the first conducting portion;
the second slider further comprises a second conducting portion, and the second hollow chute penetrates to the outside of the second slider through the second conducting portion; and
the first guide gear comprises a first raised portion, the second guide gear comprises a second raised portion, and a part of the first raised portion projects into the first conducting portion, and a part of the second raised portion projects into the second conducting portion.

19. The folding electronic device of claim 13, further comprising:
a second hinge including a second hinge bracket, a third slider and a fourth slider, the second hinge bracket being fixedly connected to the housing, and the second hinge bracket including a second arc guide portion; and
the third slider including a third arc portion, the fourth slider including a fourth arc portion, and the third arc portion and the fourth arc portion fitting with the second arc guide portion, respectively.

20. A foldable mobile terminal comprising the hinge structure of claim 1, and a foldable organic light-emitting diode (OLED) display screen;
wherein the cylindrical gear set is configured to enable power to be substantially linearly transferred from the first slider to the second slider side, or from the second slider to the first slider side such that when the first slider and the second slider are disposed opposing each other, the first slider and the second slider are configured to be driven to rotate with respect to the first hinge bracket through the cooperation of the cylindrical gear set, the first guide gear, and the second guide gear, thereby avoiding a torque generated in the synchronization mechanism and the trajectory limiting mechanism due to the misalignment of the first slider and the second slider, and extending life of the hinge structure.

* * * * *